United States Patent [19]

Nguyen et al.

[11] Patent Number: 5,418,755
[45] Date of Patent: May 23, 1995

[54] MEMORY BUFFER HAVING SELECTIVE FLUSH CAPABILITY

[75] Inventors: Andrea Nguyen, Cupertino; Joe Yeun, South San Francisco; Charles Stearns, San Jose, all of Calif.

[73] Assignee: Vertex Semiconductor Corporation, San Jose, Calif.

[21] Appl. No.: 290,671

[22] Filed: Aug. 12, 1994

Related U.S. Application Data

[63] Continuation of Ser. No. 88,127, Jul. 7, 1993, abandoned.

[51] Int. Cl.$^6$ .............................................. G11C 8/00
[52] U.S. Cl. ........................ 365/230.08; 365/189.05; 365/221
[58] Field of Search ................ 365/189.05, 230.08, 365/221

[56] References Cited

U.S. PATENT DOCUMENTS

| 5,179,679 | 1/1993 | Shoemaker | 365/189.05 |
| 5,276,849 | 1/1994 | Patel | 365/230.05 |

OTHER PUBLICATIONS

"Computer Architecture A Quantitative Approach", by John L. Hennessy and David A. Patterson, 1990, p. 458.
SPARClite User's Guide, Section 3.3 (2 pages) (1991).
LSI Logic L64815 MMU, Hot Chips 1991, p. 4.15.
DEC Alpha Chips, Hot Chips 1992, p. 1.16 (2 pages).
Intel i860, Hot Chips 1991, p. 3.17.
Ross HyperSparc, Hot Chips 1991, supplement.
Tera Microcore, Hot Chips 1991, p. 4.3.

*Primary Examiner*—Joseph A. Popek
*Assistant Examiner*—F. Niranjan
*Attorney, Agent, or Firm*—Limbach & Limbach; Ronald L. Yin

[57] ABSTRACT

A write buffer having selective flush is disclosed. The write buffer has address buffers and associated data buffers and comparators. During a "sneak read" operation, the address of the read operation is compared to the address signals stored in each of the address buffers. If a match is found, the read operation is temporarily suspended for only as long as the matched address remains stored in the write buffer. In a further improvement, the overhead associated with each match can be minimized to one write operation for each match before the matched address and data signals are written out of the write buffer.

4 Claims, 2 Drawing Sheets

MEMORY BUFFER HAVING SELECTIVE FLUSH CAPABILITY

This is a continuation of application Ser. No. 08/088,127, filed on Jul. 7, 1993, now abandoned.

TECHNICAL FIELD

The present invention relates to a memory storage device and more particularly to a write buffer interfacing between a processor or a cache memory and a main memory, with the write buffer having selective flush capability.

BACKGROUND OF THE INVENTION

Heretofore, it is known that a processor or a cache memory (such as an SRAM memory of a processor) can operate at a much faster rate than main memory (typically made of DRAM). Thus, in the prior art, it is known to use a memory buffer or write buffer interfacing between the processor or the cache memory of the processor (hereinafter collectively referred to as "processor" for either the processor or the cache memory of the processor) and the main memory. The write buffer stores digital signals, representative of digital data, from the processor to be written into the main memory. Once the data from the processor is stored in the write buffer, the processor then can continue with other operations while the write buffer operates independently to write the data from the write buffer into the main memory.

One of the problems encountered in the prior art is if a read operation to the main memory is initiated by the processor, while the contents of the write buffer are not empty. This could cause a problem if the read operation attempts to read from an address from the main memory where a previous write operation data is still in the write buffer. The read operation would then retrieve from the main memory data that has not yet been updated by the data from the write buffer. One prior art solution is to "flush" the write buffer prior to each read operation from the processor to the main memory. By flushing, it is meant that the read operation of the processor to the main memory is held up while the contents of the write buffer are all written out to the main memory. This prior art solution is typified in the device part R3081 manufactured by Integrated Device Technology (IDT) of San Jose, Calif. Whenever a read address occurs and there is data in the write buffer, the entire contents of the write buffer is "flushed" before the read operation is serviced. The problem with this prior art is the overhead associated with having to "flush" the write buffer upon every occurrence of a read operation.

In the reference entitled "Computer Architecture A Quantitative Approach" by John Hennessy, it appears that a suggestion was made that upon a read operation, "the contents of the write buffer on a read miss [operation] are checked and if there are no conflicts and the memory system is available, let the read miss [operation] continue". In addition, it is believed that write buffers from IDT operate by flushing the entire write buffer if the read address matches one of the valid addresses in the write buffer.

Since the read operation dominates cache access and is ultimately related to the performance of the processor, it is therefor desireable to minimize the overhead i.e. waiting, associated with a read operation.

SUMMARY OF THE INVENTION

A write buffer receives a plurality of address signals with each having an associated data signal from a processor means. The write buffer provides them to a memory means with one of the plurality of address signals supplied to the memory means along an address bus as an address to the memory means with the associated data signals supplied to the memory means along a data bus as the data to be stored in the memory means at the address specified by the address signal. The write buffer comprises a plurality of address storage means with each address storage means for storing one of the address signals. The write buffer also comprises a plurality of data storage means with each data storage means for storing one of the data signals associated with one of the address signals. The buffer also comprises a plurality of comparator means with each of the comparator means associated with one of the address storage means. Each of the comparator means receives the address signal from its associated address storage means and compares it to a read address signal from the processor means and generates a comparison signal in response thereto. A gate means is provided in the address bus for controlling the supply of the read address signal to the memory means. A control means receives the comparison signal from each of comparator means and controls the gate means to prevent the supply of the read address signal to the memory means for only as long as an address stored in one of the plurality of storage means matches the read address signal.

DETAILED DESCRIPTION OF DRAWINGS

Figure 1:
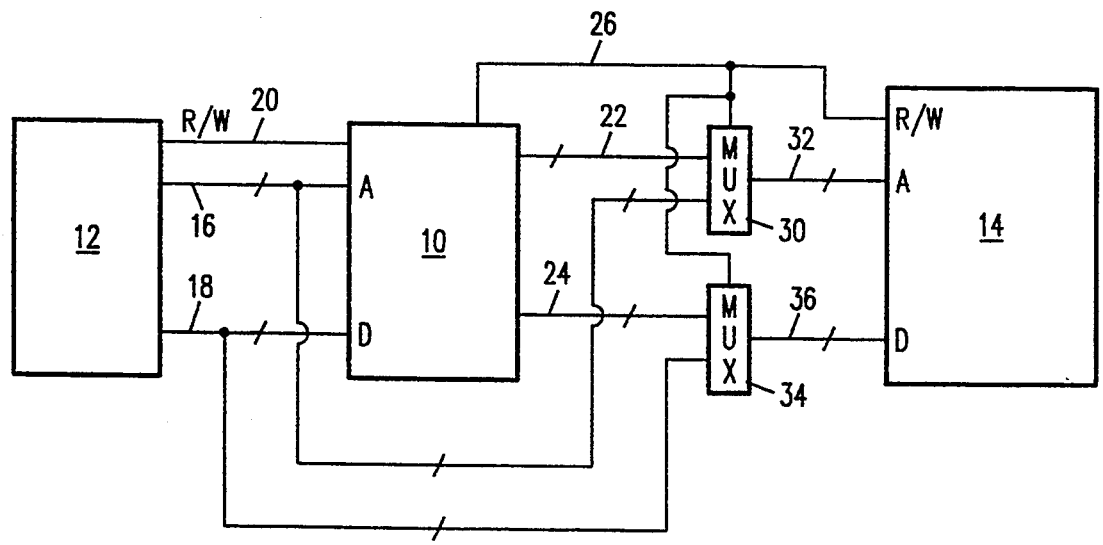
FIG. 1 is a schematic block level diagram of the write buffer of the present invention interfacing a processor and a main memory.

Referring to FIG. 1 there is shown a block level diagram of the write buffer 10 of the present invention used with a processor 12 and a main memory 14. As previously discussed, the processor 12 can be a processor or it can be the cache memory of a processor. For the purposes of the discussion hereinafter, the term "processor" will cover either of these types of devices. As is well known, the processor 12 has a first address bus 16 comprising of a plurality of address signal lines (such as 32). In addition, the processor 12 supplies data signals to and receives data signals from a first data bus 18, also comprised of a plurality of data signal lines (such as 32). Finally, the processor 12 has a plurality of control lines, only one of which is shown, a first R/W or read/write control line 20. The first R/W line 20 is a single signal line. For purposes of discussion, we shall assume that the read signal occurs when there is a high or a "1" on the first R/W 20 and write is when the first R/W line 20 goes low or is "0".

The write buffer 10 of the present invention receives the address signals from the first address bus 16, the data signals from the first data bus 18, and the first R/W line 20 from the processor 12. The write buffer 10 provides output address signals on a second address bus 22 and output data signals on a second data bus 24. The second address bus 22 has as many signal lines as the first address bus 16. The second data bus 24 has as many data signal lines as the first data bus 18. The write buffer 10 also provides a second R/W control line 26 which is supplied to the R/W port of the main memory 14.

The second address bus 22 is supplied to a first multiplexer 30. Another input to the first multiplexer 30 is the first address bus 16. The first multiplexer 30 is controlled by the second R/W control line 26. In response to the signal on the second R/W line 26, the first multiplexer 30 provides the signals from either the first address bus 22 or the second address bus 16 to be connected to a third address bus 32. The third address bus 32 is supplied to the address port of the main memory 14. Similarly, the second data bus 24 is supplied to a second multiplexer 34. Another input to the second multiplexer 34 is the first data bus 18. The second multiplexer 34 is switched by the second R/W control line 26. In response to the state of the signal on the second R/W line 26, the second multiplexer 34 connects either the signals from the second data bus 24 or the first data bus 18 to a third data bus 36. The signals from the third data bus 36 are supplied to the data port of the main memory 14.

Figure 2:
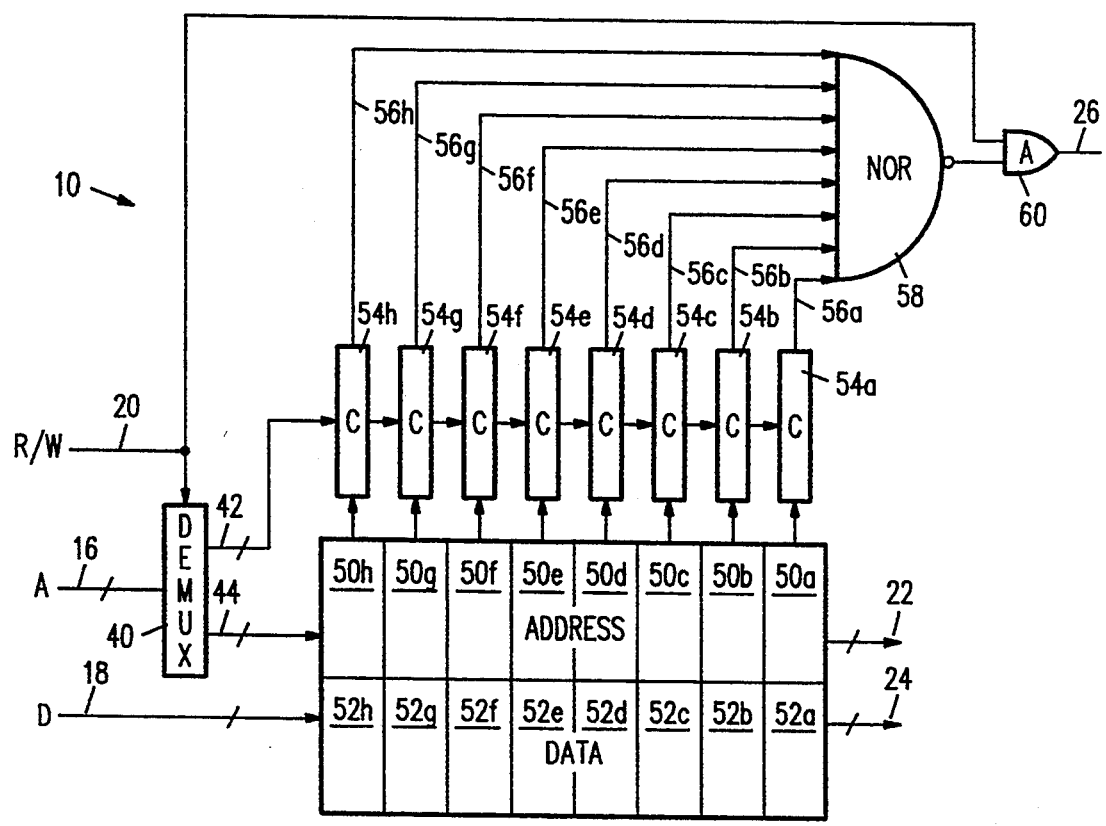
FIG. 2 is a detailed block level diagram of one embodiment of the write buffer of the present invention.

Referring to FIG. 2 there is shown a detailed block level diagram of one embodiment of the write buffer 10 of the present invention. The first R/W control line 20 controls a first demultiplexer 40. The first address bus 16 from the processor 12 is supplied to the first demultiplexer 40 and in response to the state of the demultiplexer 40, the signals from the first address bus 16 are switched to either a fourth address bus 42 or a fifth address bus 44. The signals from the fifth address bus 44 are supplied to a bank of address storages 50(A-H). While only eight storages are shown in FIG. 2, it should be apparent to those having ordinary skill in the art that any number can be chosen. The bank of address storages 50(A-H) in one preferred embodiment is a bank of circular FIFOs. Thus, address signals stored in the FIFO 50(A), closest to the second address bus 22 would be the first address signals written out of the write buffer 10, with the address signal stored in the FIFO 50(H) being the most recent address signals stored in the write buffer 10.

Each of the address storage FIFOs 50 has a corresponding associated data storage 52(A-H). The data storage 52(A-H) similar to the address storage 50(A-H), in the preferred embodiment is a circular FIFO buffer. Thus, the data signals stored in the storage 52(A) would be written out to the main memory 14 first with the data signal stored in the storage 52(H) being the most recently stored signals. Finally, each of the address storages 50(A-H) has an associated comparator 54(A-H). Each of the comparator 54(A-H) receives the signals from its associated address storage 50(A-H) and compares it to the address signals received from the fourth address bus 42. The result of that comparison, a single bit indicating either a match or a no match is generated on each of the comparison signal line 56(A-H). The plurality of comparison signal lines 56(A-H) are all supplied to a NOR gate 58. The output of the NOR gate 58 is supplied to an AND gate 60 to which the first R/W control line 20 is also supplied. The output of the AND gate 60 is the second R/W control signal 26.

The operation of the write buffer 10 will now be explained.

Write Operation of Processor

During the write operation if we assume that the first R/W control line 20 is low or "0" then the first demultiplexer 40 is switched such that the first address bus 16 is connected to the fifth address bus 44. Therefore, the address signals on the first address bus 16 and the data signals on the first data bus 18 are then loaded into address storages 50(A) and data storages 52(A) of the write buffer 10. When the next address and data signals are received by the write buffer 10, they are stored in address and data storages 50(B) and 52(B) respectively. With the first R/W control signal 20 being low, the output of the AND gate 60, the second R/W control signal 26 will also be low. Therefore, the main memory 14 is set to receive the write operation. In that event, the second R/W control signal 26 forces the first and second multiplexers 30 and 34 respectively to be in the position connecting the second address bus 22 with the third address bus 32 and connecting the second data bus 24 with the third data bus 36. In this manner, while the processor 12 continues with its other operations (because it is faster than the write buffer 10 or the main memory 14), the write buffer 10 would supply the address signals from the address storage 50(A) and the data signals from the data storage 52(A) to the address and the data ports of the main memory 14.

As the processor 12 continues with its operations, it may supply additional address signals and data signals to the write buffer 10 before the contents of the write buffer 10 have been written out to the main memory 14, In this manner, the address storage 50 and the data storage 52 may be "filled up" as processing continues. As the stored address and data signals in storages 50(A) and 52(A) are read out of the memory 10 and supplied to the main memory 14, the stored address and data signals in storages 50(B) and 52(B) are advanced and stored in storages 50(A) and 52(A).

Read Operation of Processor

During a read operation, we shall assume that the address storages 50 and the data storages 52 of the write buffer 10 still contain address signals in storages 50(A-G) and data signals in storages 52(A-G) respectively. The first R/W control line 20 would go high indicating a read operation. This would cause the first demultiplexer 40 to be switched in the position connecting the first address bus 16 to the fourth address bus 42. The address signals on the first address bus 16 are then supplied to each and every one of the comparators 54(A-H), operating simultaneously. Each of the comparators 54(A-H) would then compare the address signals supplied on the fourth address bus 42 with the contents of the address signals stored in its respective address storages 50(A-H). If no match is found meaning that there is no address in the address storages 50(A-H) which matches the address during the read cycle, then the comparison signal on each of the signal lines 56(A-H) would all go low. The output of the NOR gate 58 would then be high. This would cause the output the AND gate 60 generating the second R/W control line 26 to be high.

With the second R/W control line 26 being high, the main memory 14 is then set to receive a read operation. In addition, the second R/W control line 26 being high causes the second and the third multiplexers 30 and 34 respectively to be switched into the position connecting the first address bus 16 with the third address bus 32, and the first data bus connected to the third data bus 36. In this manner, the processor 12 would then sneak a read operation, while the operation of the write buffer 10 is temporarily suspended.

In the event address signals in one of the address storages 50 matches the address signals supplied on the first address bus 16, then at least one of the comparison signals 56(A-H) would go high. (We shall assume for this example that the address signals stored in the address location storage 50(D) matches the address signals on the first address bus 16.) Thus, the comparison signal 56(D) would then go high, indicating a match. The output of the NOR gate 58 would be low. Even though the first R/W control line 20 is high, with a low input supply to the AND gate 60, the second R/W control line 26 would remain low. With the second R/W control line 26 remaining low, the main memory 14 would continue to stay in the mode to receive a write operation. In addition, with the second R/W control line 26 being low, the first and second multiplexers 30 and 34, respectively, would continue to be in the position connecting the second address bus 22 with the third address bus 32 and connecting the second data bus 24 with the third data bus 36. In this manner, although a read operation is requested by the processor 12, the write buffer 10 continues its write operation of supplying address and data signals from its address and data storages 50 and 52, respectively, into the main memory 14.

In a subsequent clock cycle, the matched address in address storage 50(D) would then have moved to address storage 50(C). Similarly, its associated data would have moved from the data storage 52(D) to 52(C). The comparison signal 56(C) would then go high resulting in the same condition as before, namely the read operation of the processor 12 being blocked and the write operation of the write buffer 10 continued to supply address and data signals to the main memory 14. This continues until the matched address signal in address storage 50 and its associated data signals have been supplied from the address and data storages 50 and 52 into main memory 14. As soon as those address and data signals have been cleared or flushed from the address storages 50(A) and data storages 52(A), then none of the comparison signals 56(A-H) would go high (assuming there are no other matched address signals remaining in address storage 50). This would revert back to the condition of permitting the read operation from the processor 12 to access the main memory 14.

Therefore, the write buffer 10 maintains control over the main memory 14 and continues its write operation only so long as the address signals during a read operation requested by the processor 12 matches one of the address signals then still in the write buffer 10. As soon as that address signal and its associated data signals have been written into the main memory 14, the write buffer 10 of the present invention permits the processor 12 to read or access the main memory 14.

Figure 3:
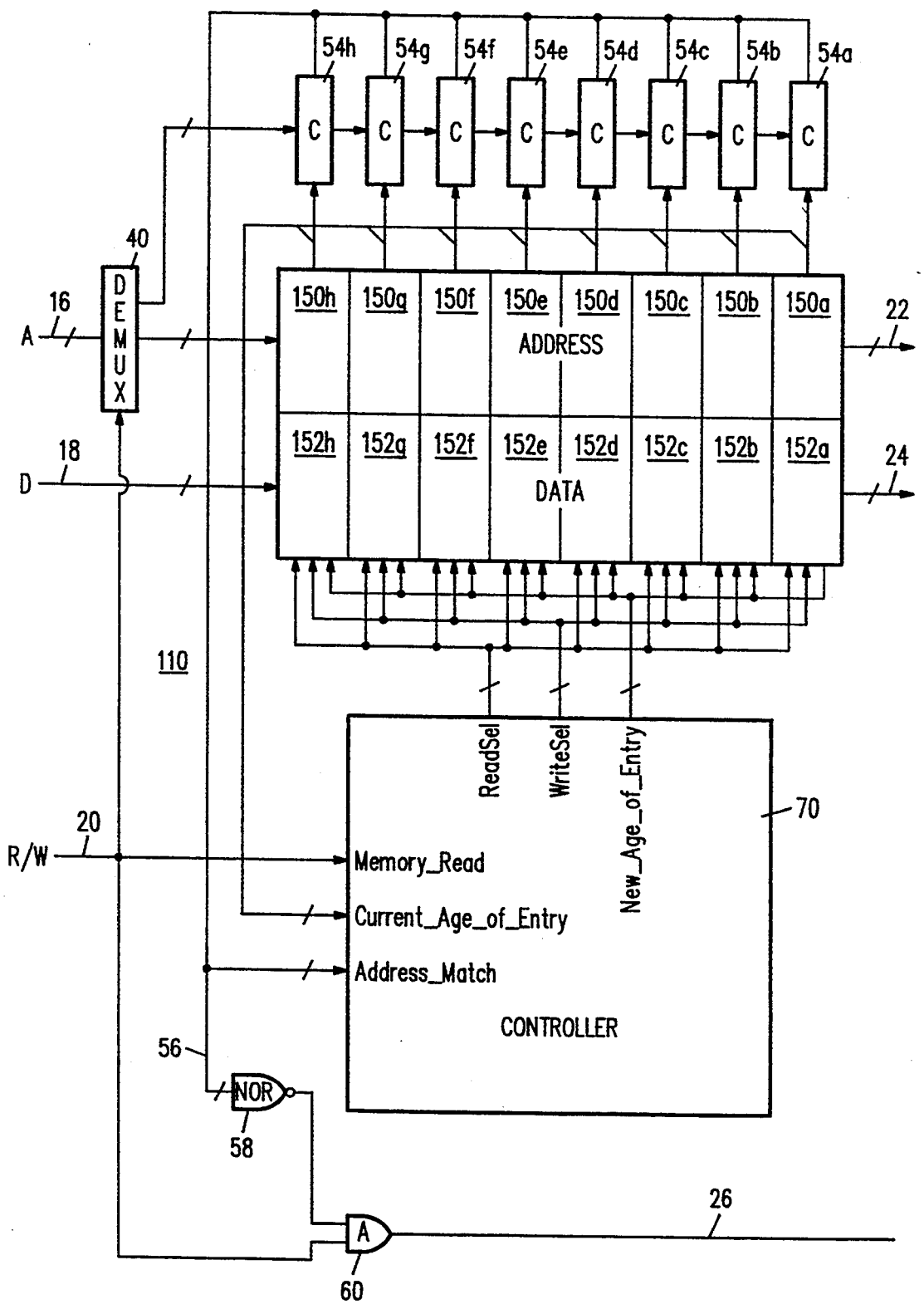
FIG. 3 is a detailed block level diagram of another embodiment of the write buffer of the present invention.

Referring to FIG. 3, there is shown another embodiment of the write buffer 10 of the present invention. As can be seen in FIG. 2, because the address storages 50 and the data storages 52 are circular FIFO buffers, if the matched address signal is stored in an address storage 50 other than the address storage 50(A), which is closest in sequence to be stored in the main memory 14, it would require a plurality of write operations by the write buffer 10 before each of the matched address signals stored in the address storage 50 is written into main memory 14.

In the write buffer 110 of FIG. 3, the matched address signals and its associated data signals can be moved to the main memory 14 as soon as a matched has occurred. This further reduces the wait time or the overhead for the read operation for the processor 12. Where identical components are described in FIGS. 2 and 3, the components shown in FIG. 3 are given the same numerical identification.

In the write buffer 110, each of the address storages 150(A-H) is an individually addressable storage location. Similarly, each of the associated data storage 152(A-H) comprises an individually addressable storage location. Each of the address storage 150 has also an associated comparator 54(A-H), which is identical to the comparator 54(A-H) shown in FIG. 2. Each of the comparators 54(A-H) generates an output comparison signal 56(A-H) which is identical to the comparison signal 56(A-H) discussed for FIG. 2. The plurality of comparison signals 56 are supplied to the NOR gate 58 which is then supplied to the AND gate 60 which provides for the second R/W control signal 26. The third demultiplexer 40 operates in the same manner as the third demultiplexer 40 shown and described in FIG. 2. Finally, the write buffer 110 comprises a controller 70 which receives a plurality of input control signals and provides a plurality of output control signals, each of which will be described. The plurality of input control signals to the controller 70 consists of the first R/W control 20, which has been discussed heretofore. In addition, the controller 70 receives a plurality of control signals designated as Current_Age_of_Entry. The Current_Age_of_Entry signal is an output signal from each of the address storages 150(A-H) and determines the range of the age of the entries starting from the entry that was written in the address storages 150 the earliest, until the age of the entry of the address storage 150 that was written in most recently. Finally, the other input control signals to the controller 70 are provided by the plurality of comparison signals 56 and is designated as Address _Match.

The controller 70 generates a plurality of output control signals. They are as follows. The ReadSel control signals are a plurality of control signals which determine which of the address and data storages 150 and 152, respectively, are to be addressed so that its contents may be written onto the second address bus 22 and the second data bus 24, respectively. As previously stated, the address storages 150 and the data storages 152 are individually addressable and the contents may be placed directly onto the second address bus 22 and the second data bus 24 respectively. The ReadSel bus is an address to select the particular address storage 150 and the data storage 152. The WriteSel control signals provide the address of the address storage 150 and the address of the data storage 152 for the address signals and the data signals to be written into the storages 150 and 152, from the processor 12. Again, similar to the ReadSel signals, the WriteSel signals are signals that select the particular address storage 150 and the data storage 152. Finally, the control signals New_Age_of_Entry provides a "time stamp" of how long the entry has been in the address storages 150 and the data storages 152. It indicates how stale or how fresh the data is in those storages 150 and 152. Collectively with all the other age of entry signals, they provide an indication of which storages 150 and 152 was written into the earliest, and which storages 150 and 152 the most recently.

The operation of the write buffer 110 will now be described.

Write Operation of Processor

During the write operation, the address signals from the first address bus 16 and the data signals from the first data bus 18 are provided to the address and data storages 150 and 152. Based upon the availability of the address storages 150 and the data storages 152, the WriteSel control signals are provided to indicate into which address storages 150 and data storages 152 the address signals and the data signals ought to be written into. As signals from the processor 12 are written into the write buffer 110, the age of that entry is then noted. In providing data from the write buffer 110 to the main memory 14, the controller 70 would receive a list of the Current_Age_of_Entry of each of the address storages 150 and the data storages 152. The oldest entry would then be selected by the ReadSel control signals which would place the address signals on the second address bus 22 and its associated data signals on the second data bus 24. The writing of the data from the write buffer 110 to the main memory 14 occurs in the order of the oldest entry being written out first. As with the discussion for the embodiment mentioned on FIG. 2, the second R/W control signal line 26 would be maintained in the low or "0" position thereby keeping the first and the second multiplexers 30 and 34 respectively in the position, connecting the second address bus 22 with the third address bus 32 and connecting the second data bus 24 with the third data bus 36. Thus, in this manner, functionally, the write buffer 110 during a write operation of a processor 12 operates the same as the write buffer 10.

Read Operation of Processor

First, we shall assume that again, there is no match between the address signals on the first address bus 16 and the address signals stored in the address storages 150. In that event, the output of the NOR gate 58 would be high causing the output of the AND gate 60 to go high. This would cause the second R/W control signal line 26 to go high placing the main memory 14 to receive the read operation. In addition, this would cause the first and second multiplexers 30 and 34 respectively to connect the first address bus 16 with the third address bus 32 and the first data bus 18 with the third data bus 36. Thus, the processor 12 can then read the main memory 14. Again, functionally this is the same as the write buffer 10.

If we assume that a single matched address signal is stored in the address storage 150(D), then the output of the comparators 54(A-H) would result in a comparison signal 56(D), going high. This would cause the output of the NOR gate 58 to be low. This would cause the second R/W control signal 26 to go low keeping the main memory 14 in the mode to receive a write operation. This would further cause the first and second multiplexers 30 and 34 to be in the position, connecting the second address bus 22 with the third address bus 32 and the second data bus 24 with the third data bus 36. Since the controller 70 receives the first R/W control signal 20 as being in a read mode and it also receives a high on the comparison signal 56(D), it would select the ReadSel control signals to cause the address storage 150(D) to be selected. This would cause the address signals in the address storage 150(D) to be placed on the second address bus 22. In addition, the same ReadSel control lines would cause the data signals from the data storage 152(D) to be placed on second data bus 24. With the address signals and the data signals on the third address bus 32 and the third data bus 36, a write operation to the main memory 14 would then occur. Once the contents of the address storage 150(D) and the data storage 152(D) have been read out, they are "zeroed out" or an associated bit is set indicating the address and data storages 150(D) and 152(D) can now be written into. This would cause the comparator 54(D) to then go low. With the comparison signals 56 all going low, the processor 12 can now read the main memory 14.

In the event more than one address signals in address storages 150 matches the address signals on the first address bus 16, then the controller 70 selects the address storage 150 having the earliest entry to be first read out and placed onto the second address bus 22 and its associated data signals to be read out and placed onto the data bus 24 to be written into the main memory 14. If there is a subsequent match, then the next current entry is read out of the address storages 150 and the data storage 152 to be written into the main memory 14. When all of the matched address signals are read out of the address storage 150 and its associated data out of data storage 152 are written into the main memory 14, then the processor 12 can perform a read operation on the main memory 14. Thus, in this embodiment, the overhead associated with a read operation from the processor 12 with a matched address signal in the write buffer 110 is greatly reduced.

As can be seen from the foregoing, an improved write buffer has been disclosed which greatly minimizes the overhead associated with a write buffer when a processor is trying to read the main memory. More particularly, the write buffer is flushed and the read operation of the processor 12 is temporarily suspended for only as long as the matched address remains in the write buffer. Furthermore, in one embodiment, the overhead can be as little as one write cycle to flush out a single matched address and its associated data.

What is claimed is:

1. A write buffer for receiving a plurality of address signals with each having an associated data signal from a processor means and for providing same to a memory means, with one of the plurality of address signals supplied to said memory means along an address bus as the address to said memory means with the associated data signal provided to said memory means along a data bus as the data to be stored in the memory means at the address specified by the address signal, said write buffer comprising:

a plurality of address storage means, with each address storage means for storing one of said address signals;

a plurality of data storage means, with each data storage means for storing one of said data signals associated with one of said address signals;

a plurality of comparator means, with each of said comparator means associated with one of said address storage means;

each of said comparator means receives the address signal from its associated address storage means and for comparing same to a read address signal from the processor means and for generating a comparison signal in response thereto;

gate means in the address bus for controlling the supply of the read address signal to the memory means; and control means for receiving the comparison signal from each of the said comparator means and for controlling the gate means to prevent the supply of the read address signal to the memory means for only as long as an address signal stored in one of the plurality of address storage means matches the read address signal.

2. The buffer of claim 1 wherein said control means further comprises:

means for selecting the address signal, stored in the plurality of address storage means which matches the read address signal, and its associated data signal, and supplying same directly to the memory means.

3. The buffer of claim 1 wherein said plurality of address storage means are arranged to provide address signals sequentially to said memory means.

4. The buffer of claim 3 wherein said control means further comprises:

NOR gate means for receiving the comparison signal from each of said comparator means and for generating a first output signal in response thereto; and AND gate means for receiving the first output signal, a signal indicative of the read or write operation and for generating a control signal in response thereto; said control signal for controlling said gate means in the address bus.

* * * * *